United States Patent
Givens et al.

[19]

[11] Patent Number: 6,054,768
[45] Date of Patent: Apr. 25, 2000

[54] METAL FILL BY TREATMENT OF MOBILITY LAYERS

[75] Inventors: John H. Givens, Meridian; Russell C. Zahorik, Boise; Brenda D. Kraus, Meridan, all of Id.

[73] Assignee: Micron Technology, Inc., Boise, Id.

[21] Appl. No.: 08/942,811

[22] Filed: Oct. 2, 1997

[51] Int. Cl.$^7$ .................................................. H01L 23/48
[52] U.S. Cl. .................. 257/753; 257/750; 257/753; 257/618; 438/424; 438/427
[58] Field of Search .................................. 257/750, 753, 257/618; 438/427, 424, 700

[56] References Cited

U.S. PATENT DOCUMENTS

| | | | |
|---|---|---|---|
| 5,242,860 | 9/1993 | Nulman et al. | 437/190 |
| 5,282,018 | 1/1994 | Hiraki et al. | 257/296 |
| 5,312,772 | 5/1994 | Yokoyama et al. | 437/190 |
| 5,371,042 | 12/1994 | Ong | 437/194 |
| 5,381,046 | 1/1995 | Cederbaum et al. | 257/760 |
| 5,420,072 | 5/1995 | Fiordalice et al. | 437/192 |
| 5,484,747 | 1/1996 | Chien | 437/190 |
| 5,545,592 | 8/1996 | Iacoponi | 437/200 |
| 5,604,156 | 2/1997 | Chung et al. | 438/620 |
| 5,654,235 | 8/1997 | Matsumoto et al. | 438/643 |
| 5,691,571 | 11/1997 | Hirose et al. | 257/751 |
| 5,723,362 | 3/1998 | Inoue et al. | 437/190 |
| 5,725,739 | 3/1998 | Hu | 438/568 |
| 5,747,384 | 5/1998 | Miyamoto | 468/685 |
| 5,780,356 | 7/1998 | Kim | 438/627 |
| 5,843,837 | 12/1998 | Baek et al. | 438/627 |
| 5,847,459 | 12/1998 | Taniguchi | 257/751 |
| 5,858,877 | 1/1999 | Dennison et al. | 438/700 |

FOREIGN PATENT DOCUMENTS

| | | | |
|---|---|---|---|
| 63-111666 | 5/1988 | Japan | 257/753 |
| 6-45281 | 2/1994 | Japan | 257/751 |

*Primary Examiner*—Sheila V. Clark
*Assistant Examiner*—H. D. Tran
*Attorney, Agent, or Firm*—Workman, Nydegger & Seeley

[57] ABSTRACT

A recess having a height-to-width aspect ratio from about 6:1 to about 10:1 in a semiconductor structure is taught with a method of forming the same. In a first embodiment, a refractory metal layer is formed in the recess, which can be a trench, a contact hole, or a combination thereof. A refractory metal nitride layer is then formed on the refractory metal layer. A heat treatment, preferably RTP, is used to form a metal silicide contact at the bottom of the contact hole upon semiconductor material. In a first alternative method, an ammonia high-temperature treatment is conducted to remove undesirable impurities within the refractory metal nitride layer lining the contact hole and to replace the impurities with more nitrogen. In a second alternative method, a second refractory metal nitride layer is formed by PVD upon the first refractory metal nitride layer. In either alternative, a metallization layer is deposited with the recess. High pressure and temperature are used to substantially fill the recess with the metallization layer. In a preferred embodiment, deposition of the first refractory metal nitride layer is accomplished using trimethylethylenediamine tris (dimethylamino) titanium (TMEDT). The aspect ratio of a recess that can be substantially filled can exceed 8:1 when using a TMEDT-deposited refractory metal nitride layer and a subsequent deposition of a second refractory metal nitride layer by PVD. Following the substantially filling of the recess, residual surface metallization may be at least partially removed by such techniques as etch back or CMP.

31 Claims, 5 Drawing Sheets

METAL FILL BY TREATMENT OF MOBILITY LAYERS

BACKGROUND OF THE INVENTION

1. The Field of the Invention

The present invention relates to a high aspect-ratio contact in a semiconductor device and a method of forming the same. In particular, the present invention relates to formation of a contact in a semiconductor device with a refractory metal and a refractory metal nitride liner that assists in filling of a contact hole in which the contact is situated. More particularly the present invention relates to an aluminum or aluminum alloy filled contact plug that fills a contact hole in a semiconductor device that is lined with a titanium layer and at least one titanium nitride layer. The titanium and the first of the at least one titanium nitride layers are formed by chemical vapor deposition. Subsequently formed titanium nitride layers, if any, are formed by physical vapor deposition (PVD).

2. The Relevant Technology

In the microelectronics industry, a substrate refers to one or more semiconductor layers or structures which includes active or operable portions of semiconductor devices. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above.

In the fabrication of semiconductor devices, metal contacts are formed over semiconductor substrates that have been processed to form devices connected to each other to form integrated circuits. In particular, aluminum and aluminum alloy lines have been deposited into vias and other recesses such as trenches and contact corridors. This method of metallization is used generally in the microelectronics industry. However, as devices have been miniaturized, due to requirements for a higher device density on a semiconductor substrate and a smaller device, the recesses to be filled have higher aspect ratios, where an aspect ratio is the depth of the recess divided by the width thereof.

One need for higher aspect ratio recesses is the formation of deeper contacts where, for example, a stacked capacitor for a dynamic random access memory (DRAM) is formed and then covered over by a dielectric layer. For such as a stacked DRAM capacitor, a contact with an aspect ratio greater than 5:1 would need to be formed in two steps using known prior art processes. Such prior art processing produces a conductive structure having two interconnect halves with a physical seam therebetween. Typically, the two interconnect halves have a width or cross-sectional footprint of about 0.35 microns or smaller. Alignment By of the small footprint interconnect halves is problematic at best, and fabrication yield with such a process prerequisite is undesirable. Also undesirable is an increased resistivity caused by the physical seam between the two interconnect halves.

Difficulties have been encountered in depositing aluminum lines and contacts by conventional sputtering processes when submicron high aspect ratio recesses are to be filled. As a recess is made smaller and deeper (i.e. higher aspect ratio), the bottom and sides of the recess will receive less sputtered target material than the opening to the recess. Additional sputtering will result in a detrimental phenomena known as bread loafing where a layer of sputtered target material closes off the opening to the recess. Thus over time, the bottom and sides of the recess receive inadequate amounts of the sputtered metal material and the sputtered metal material overhangs and closes over the opening to the recess before the recess is substantially filled.

While the aluminum and the silicon in the semiconductor substrate must be electrically connected, it has become useful to use intermediate layers to provide better electrical connection to the silicon, and to provide a metallurgical barrier between silicon and aluminum to prevent spiking of the aluminum into the silicon. Spiking can interfere with the performance and reliability of the integrated circuit. Conventionally, one method which has been used to accomplish the metallurgical barrier has been to form a layer of titanium over a semiconductor substrate at the interconnect-exposed site. Titanium silicide is then formed at the interconnect-exposed site, and a titanium nitride layer is formed elsewhere, in that the titanium layer is exposed to a nitrogen atmosphere. While this method forms a metallurgical barrier between silicon and aluminum to prevent spiking, it often is inadequate to form the titanium nitride barrier because of the competing simultaneous formation of titanium silicide and titanium nitride at the titanium region that covers the exposed semiconductor substrate site.

One prior art solution to this inadequate prior art method has been to form the titanium silicide barrier layer first and then to sputter additional titanium nitride over the titanium silicide or titanium silicide/titanium nitride layer. In this way, a sufficient thickness of titanium nitride may be formed to provide a desired thickness in a barrier layer.

As stated, sputtered layers of titanium nitride have been used in integrated circuits as barrier layers for recesses such as contact holes, vias, and interconnects. Sputter deposited titanium nitride, however, is not very conformal and its step coverage within high aspect ratio recesses is poor. As such, there results an unacceptably thin or discontinuous titanium nitride barrier layer for a high aspect ratio recess.

As aspect ratios have been increasing for recesses in microelectronic devices, the need for substantial recess filling with sputtered aluminum and aluminum alloy metallization material has proved inadequate in spite of improved titanium nitride barrier layers. While high pressure and/or high temperature aluminum reflow recess filling techniques have been developed, a substantially filled recess having an aspect ratio exceeding 5:1 has been difficult or impractical to achieve.

It has been proposed to form a titanium nitride layer in the recess by chemical vapor deposition (CVD), for example by using titanium tetrachloride ($TiCl_4$) in the presence of $NH_3$, $H_2$, and Ar. Although the $TiCl_4$ CVD process has improved reflow techniques, substantially filled recesses with aspect ratios greater than about 5:1 have been elusive. One problem that has been experienced is that aluminum reflow requires a substantially pristine refractory metal nitride surface, whereas interstitial titanium nitride layer impurities incident to the $TiCl_4$ CVD process have caused the aluminum to become impure. As a result, aluminum loses its relatively low-friction flowing or sliding ability over the impure titanium nitride layer.

Methods have been proposed to drive the interstitial impurities out of the titanium nitride layer by using thermal energy, but the thermal limit or budget of the fabrication process must be monitored so as avoid a yield decrease. Additionally, it has been observed that a thermal cleansing of the titanium nitride layer leaves significant voids in the titanium nitride layer that also resists flow of the aluminum there across. Attempts have been made to "stuff" the interstices in the titanium nitride layer with nitrogen. Even with a stuffing technique, however, substantially filled recesses with aspect ratios that exceed 5:1 are not readily realized.

What is needed is a method of lining and substantially filling a high aspect ratio recess with aluminum metallization or equivalents in microelectronic device fabrication where the aspect ratio of the recess exceeds 5:1. What is also needed is a method of forming a high aspect ratio structure that allows for a taller microelectronic component, such as a taller stacked DRAM capacitor, where the interconnect to the stacked DRAM capacitor is unitary and formed by a single recess filling process.

SUMMARY OF THE INVENTION

The present invention relates to a substantially filled recess in a semiconductor structure, where the recess has a height-to-width aspect ratio in a range from about 6:1 to about 10:1, and where the width is about 0.35 microns or smaller. The process steps and achieved structure in accordance with an embodiment of the invention comprise an interconnect in a recess having an aspect ratio that exceeds about 6:1. The recess, for example, can be a via, a trench, a contact corridor, or a combination thereof. In a first embodiment of the present invention, the recess is a contact hole that is substantially filled by first performing a surface pre-cleaning of the contact hole followed by degassing. Following degassing, a refractory metal layer is formed, and a refractory metal nitride layer is formed on the refractory metal layer. A heat treatment step, preferably by rapid thermal processing (RTP), is used to secure a refractory metal silicide contact upon semiconductor material such as silicon at the bottom of the contact hole.

At least two alternative methods may be carried out after heat treatment. In a first alternative, a high-temperature $NH_3$ treatment is carried out to remove undesirable impurities within the contact hole and to replace the impurities in the refractory metal nitride layer with more nitrogen. In the second alternative, a second refractory metal nitride layer is formed by PVD upon the first refractory metal nitride layer. In either alternative, a metallization layer is deposited within the contact hole. Preferably, aluminum is used in a fast metallization deposition technique and alternatively by use of elevated temperatures to substantially fill the contact hole with aluminum. High pressure and temperature can also be used in combination in the inventive method to substantially fill the contact hole with aluminum.

In yet another embodiment of the present invention, the steps of precleaning, degassing, and deposition of a refractory metal layer are accomplished as set forth above. Deposition of the first refractory metal nitride layer is accomplished using trimethylethylenediamine tris (dimethylamino) titanium (TMEDT). Use of TMEDT allows for a higher density of titanium and nitrogen to form in the contact hole than that achieved in previous metal-organic deposition techniques. The aspect ratio achieved by a TMEDT-deposited refractory metal nitride layer and the subsequent deposition of a second refractory metal nitride layer by PVD may exceed 8:1.

Following filling of the contact hole, residual surface metallization may be entirely removed by such techniques as etchback or by a planarization technique such as chemical mechanical planarization (CMP). Partial CMP of the surface metallization may be carried out, wherein a portion of the surface metallization remains to be patterned and treated to form metallization lines. CMP of the surface metallization assists in preventing unwanted reflective characteristics.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. The accompanying drawings, although illustrative of the inventive methods and structures, are not to be construed as dimensionally precise as to both methods and structures. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention relates to formation of a metal filled recess in a semiconductor structure, where the recess has a height-to-width aspect ratio in a range from about 6:1 to about 10:1, and where the width is about 0.35 microns or smaller. The inventive method is carried out by formation of preferred liner layers within the recess, and by force-filling the recess with a metallization layer that flows over and moves across the preferred liner layers to facilitate substantial filling of the recess. FIGS. 1 through 5 are cross-sectional views of a semiconductor structure being subjected to process steps in accordance with an embodiment of the invention, wherein an inventive interconnect is formed as part of the semiconductor structure.

Figure 1:
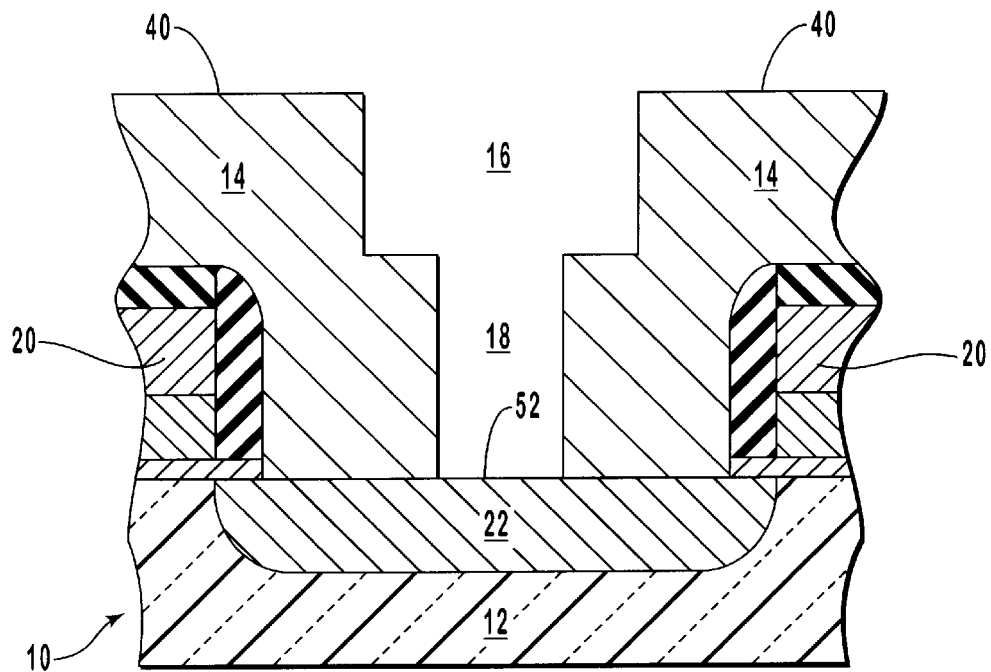
FIG. 1 is an elevational cross-section illustration of a semiconductor structure having a trench above a contact hole, where the contact hole terminates at an exposed surface on an active area.

In FIG. 1, a semiconductor structure 10 is illustrated, comprising a semiconductor substrate 12 and an active area 22. A dielectric layer 14 has been deposited over, by way of non-limiting example, a gate stack that is generally seen at reference numeral 20. Gate stack 20 is situated upon semiconductor substrate 12. Alternatively, semiconductor structure 10 (and semiconductor substrate 12 therein) may, for example, comprise a polysilicon layer formed over other layers of a semiconductor structure to provide electrical contact to an active device. Semiconductor structure 10 may also comprise some other type of polysilicon-connecting interconnecting structure.

In dielectric layer 14, etching has formed a trench 16 and a contact hole 18. Semiconductor structure 10 has a first exposed surface 40 that includes the surface defining trench 16 and contact hole 18 with an exposed surface 52 on active area 22 at the bottom of contact hole 18. Dielectric layer 14 has a top surface above a recess, where the recess includes trench 16 and contact hole 18. Contact hole 18 extends from an exposed portion of semiconductor substrate 12 to terminate at an opening to contact hole 18 below the top surface of dielectric layer 14. Trench 16 is elongated and extends from a trench opening at the top surface of dielectric layer 14 to terminate at the contact hole opening below the top surface of dielectric layer 14.

Figure 1A:
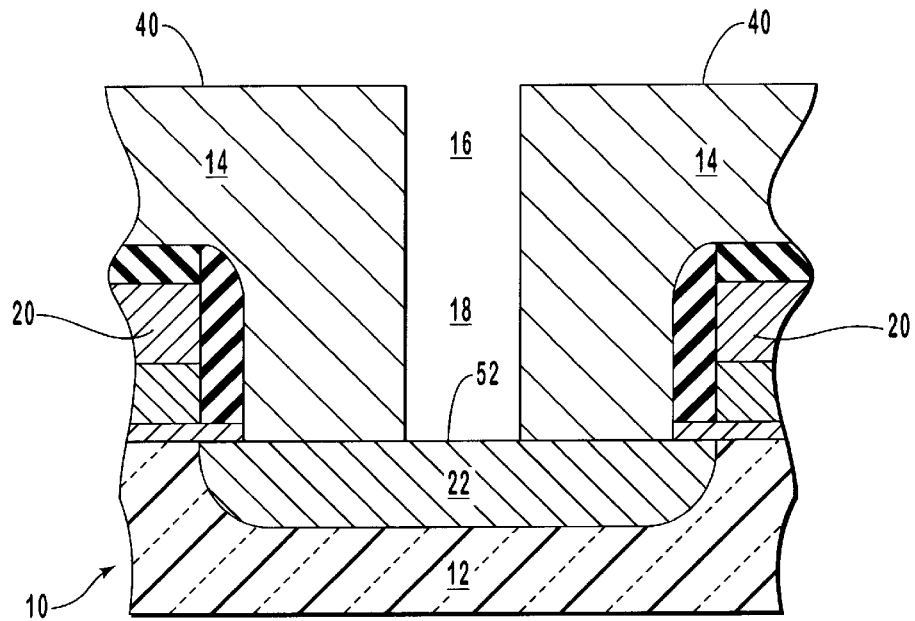
FIG. 1A is an elevational cross-section illustration of an alternative embodiment of FIG. 1.
Figures 1B, 1C, 1D:
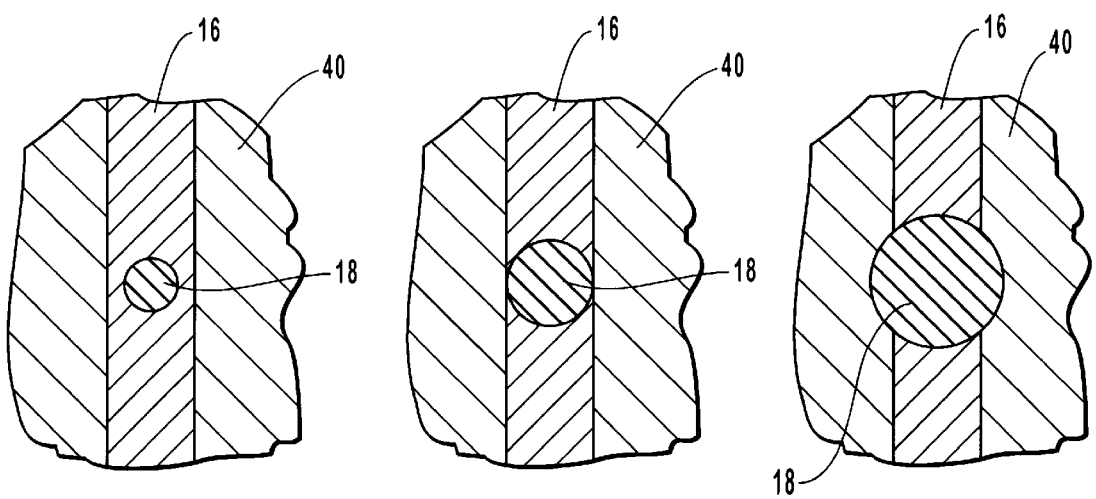
FIGS. 1B through 1D are partial top plan views of alternative embodiments of a semiconductor structure having a trench above a contact hole.

Two alternative embodiments for the respective dimensions of trench 16 and contact hole 18 are contemplated. In a first alternative seen in FIG. 1, the opening to trench 16 has a width that is wider than the width of the opening to contact hole 18, and trench 16 has a length that is substantially parallel to semiconductor substrate 12, which length can exceed the width of the opening to contact hole 18. FIG. 1B shows a top plan view of FIG. 1. In a second alternative seen in FIG. 1A, the opening to trench 16 has a width that is equal to the width of the opening to contact hole 18, and trench 16 has a length that is substantially parallel to semiconductor substrate 12, which length is greater than the width of the opening to contact hole 18. FIG. 1C is a top plan view of FIG. 1A. FIG. 1D is a top plan view of a contact hole extending from first exposed surface 40 to exposed surface 52 on active area 22, where the width of the opening to contact hole 18 is shorter than the length of trench 16 and wider than with width of trench 16. Processing of the structures seen in FIGS. 1A–1D are contemplated to be as would the processing for the structures seen in FIGS. 2–7. In general, the invention contemplates that the width of the trench can be less than or equal to the width of the opening to the contact hole. The length of the trench, however, must be greater than the width of the opening to the contact hole.

In a first embodiment of the present invention, trench 16 and contact hole 18 are filled by first performing a surface pre-cleaning upon semiconductor structure 10. Pre-cleaning can be by an HF dip, by way of example, in a 100:1 aqueous solution for about 30 seconds. The HF dip is followed by a degassing process in which semiconductor structure 10 is placed in a chamber in which it is subjected to a vacuum and elevated temperatures.

Figure 2:
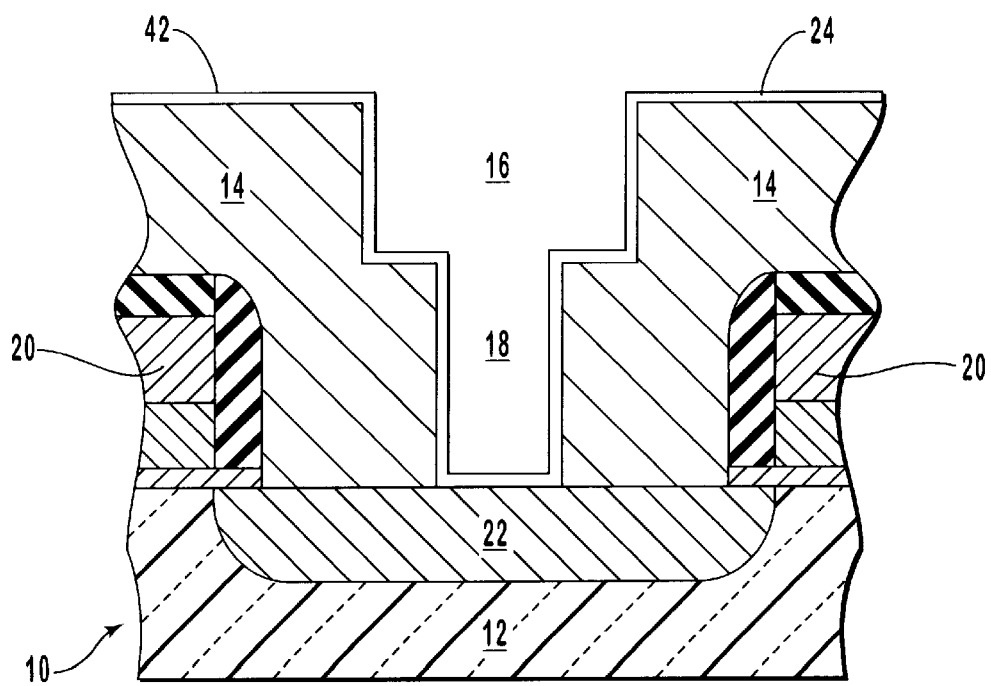
FIG. 2 is an illustration of the semiconductor structure depicted in FIG. 1 in which a refractory metal layer has been deposited that covers the trench, the contact hole, and the exposed active area surface.

Following the degassing process, a first layer is formed upon first exposed surface 40. The first layer is seen in FIG. 2 as a refractory metal layer 24 which is composed of titanium, although other refractory metals could also used. Deposition of refractory metal layer 24 is preferably accomplished by chemical vapor deposition (CVD). The thickness of the refractory metal is dependent upon the specific application for forming a contact to the active area within the recess. A preferred thickness range of refractory metal layer 24 when refractory metal layer 24 comprises titanium, is from about 0 Å to about 400 Å, a more preferred thickness is from 100 Å to about 300 Å, and a most preferred thickness is about 200 Å.

Figure 3:
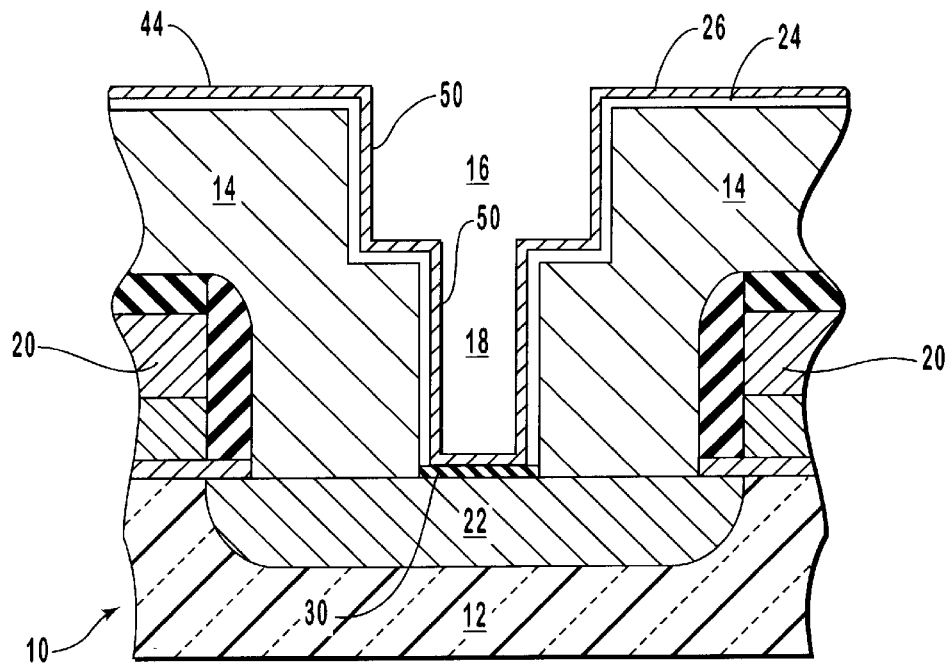
FIG. 3 illustrates further processing of the semiconductor structure depicted in FIG. 2, in which a first refractory metal nitride layer has been deposited substantially conformably over the refractory metal layer, and a heat treatment has induced formation of a refractory metal silicide layer upon the exposed surface of the active area at the terminal end of the contact hole.

FIG. 3 illustrates a first metal nitride layer 26 formed by CVD. First metal nitride layer 26 may be formed in the same chamber used for formation of refractory metal layer 24, and can be composed of refractory metal nitrides of titanium, cobalt, tungsten, and the like. First metal nitride layer 26 may be formed. Care must be taken that refractory metal layer 24 does not prematurely form a refractory metal silicide layer 30 which is needed later on in the fabrication process to form a desired metallurgical junction.

Following formation of first metal nitride layer 26, a heat treatment, preferably by rapid thermal anneal (RTA) causes a reaction of active area 22 with the silicon in semiconductor substrate 12 of exposed surface 52 so as to form refractory metal silicide layer 30 at the bottom of contact hole 18. As such, refractory metal silicide layer 30 forms a metallurgical junction between semiconductor substrate 12 and the eventual contact plug that will fill contact hole 18. In the processing of semiconductor structure 10, wherein refractory metal layer 24 is comprised substantially of titanium and wherein at least first metal nitride layer 26 is comprised substantially of titanium nitride, RTA preferred temperature is in a range from about 100° C. to about 660° C. for a processing time in a range from about 10 seconds to about 60 seconds.

Impurities that may exist within a wall 50 of first metal nitride layer 26 that lines trench 16 and contact hole 18 can be removed by an ammonia high-temperature treatment. Such impurities can be introduced to wall 50 incident to formation of first metal nitride layer 26. The high-temperature treatment effectively displaces impurities on wall 50 with more nitrogen from the ammonia gas in the ammonia high-temperature treatment. The ammonia high-temperature treatment is preferably conducted at temperatures in a range from about 100° C. to about 500° C., more preferably in a range from about 200° C. to about 400° C., and most preferably about 300° C. Ammonia treatment may be carried out with or without conventional plasma assistance.

Figure 4:
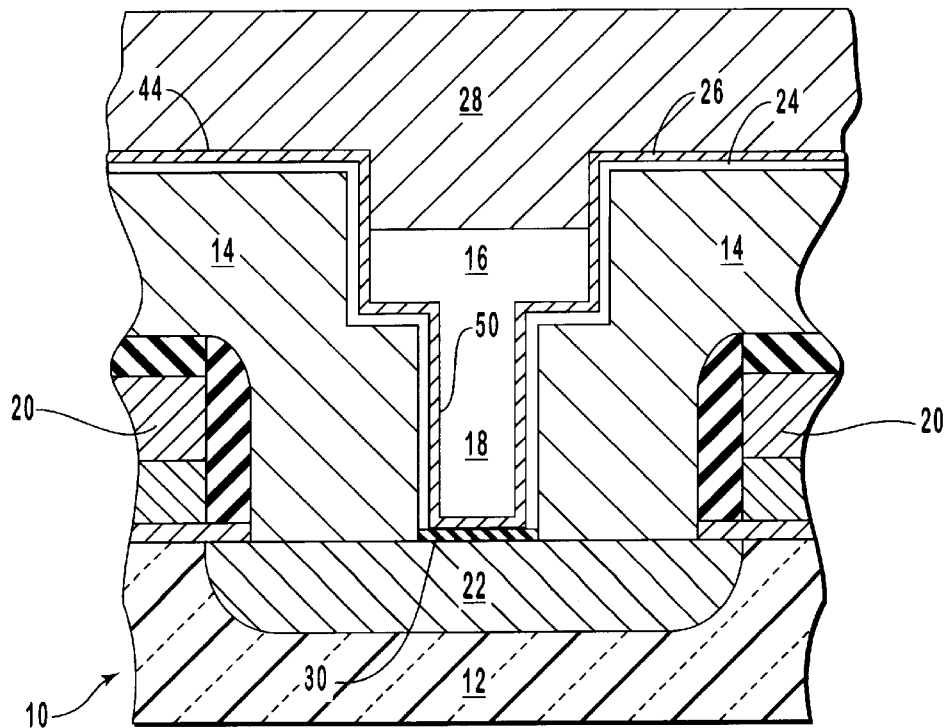
FIG. 4 illustrates further processing of the semiconductor structure depicted in FIG. 3, including formation of a metallization layer to cover the opening to the trench and contact hole.

Following the ammonia high-temperature treatment, an aluminum layer 28 seen in FIG. 4 is deposited over trench 16 and contact hole 18. With respect to underlying materials, for example, Al, an AlCuSi alloy, or AlCu alloy can be deposited over titanium nitride. As can be seen in FIG. 4, aluminum layer 28 does not substantially fill contact hole 18. A preferred thickness of the deposited aluminum layer 28 is in a range from about 0.5 micrometers to about 2.0 micrometers, or more preferably about 0.5 micrometers to about 1.7 micrometers.

Preferably, aluminum layer 28 is formed by a fast metallization deposition technique, such as a fast alloy physical vapor deposition (PVD) technique. The process for forming aluminum layer 28 can also be accompanied by elevated temperatures. Preferable conditions for the deposition of aluminum layer 28 can be set forth in two (2) protocols. In a first protocol for PVD formation of aluminum layer 28, the energy range is from about 0.5 kW to about 5 kW, preferably from about 1 kW to about 3.5 kW, and most preferably from about 1 kW to about 2 kW. Also in the first protocol, the temperature during the PVD process is in a range from about 350° C. to about 600° C., more preferably from about 400° C. to about 575° C., and most preferably from about 450° C. to about 550° C. In a second protocol for the PVD formation of aluminum layer 28, the energy range is from about 10 kW to about 14 kW, preferably about 11 kW to about 13 kW, and most preferably about 12 kW. Also in the second protocol, the temperature during the PVD process is in a range from about 400° C. to about 550° C., more preferably from about 450° C. to about 510° C., most preferably about 480° C.

Figure 5:
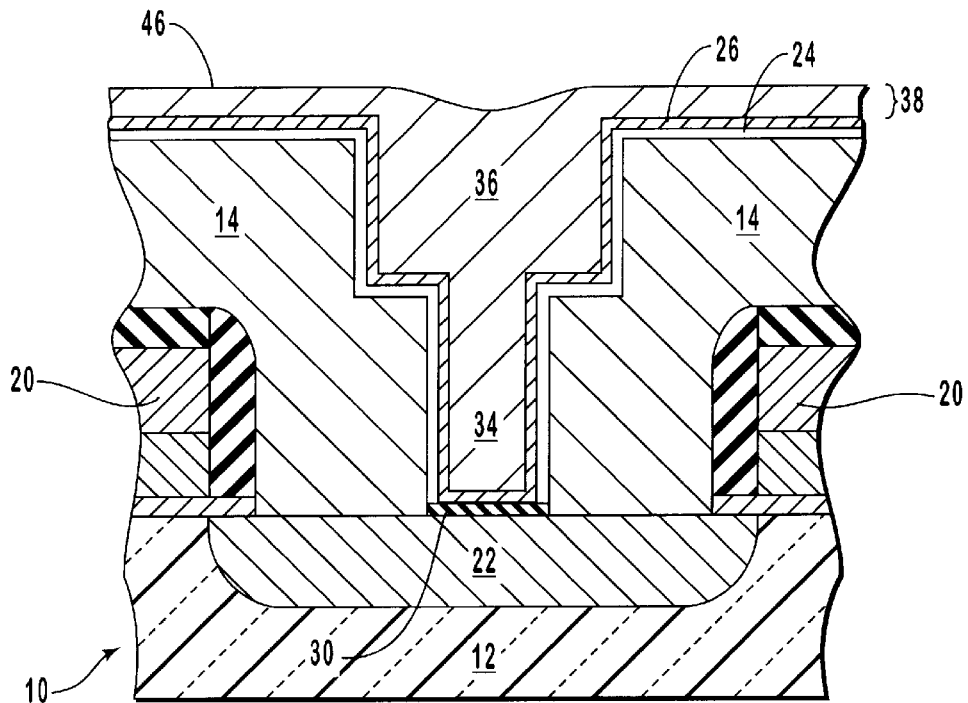
FIG. 5 illustrates further processing of the semiconductor structure depicted in FIG. 4, and also illustrates an article of manufacture embodiment achieved by the inventive method, wherein the trench and contact hole have been substantially filled with a metallization layer by the inventive method to form a contact plug, and wherein a selected thickness of the metallization layer remains above the trench upon the semiconductor structure.

FIG. 5 illustrates an achieved article of manufacture that, by way of non-limiting example, is a bit line that extends from a trench to active area 12 between two gate stacks 20. Substantial filling of trench 16 and contact hole 18 with aluminum layer 28 is realized by the preferred liner layers of refractory metal layer 24 and first metal nitride layer 26 which are low in impurities. These preferred liner layers, in combination with high pressure and high temperature allow aluminum layer 28 to realize a relatively low-friction flowing or sliding motion into trench 16 and contact hole 18 so as to substantially fill the same. In a preferred embodiment where refractory metal layer is Ti, and first metal nitride layer 26 is TiN treated with a high-temperature ammonia treatment, both trench 16 and contact hole 18 are substantially filled at a temperature of about 520° C. and at a pressure of about 750 atmospheres, which temperature and pressure is held for a duration of about four minutes.

Figure 6:
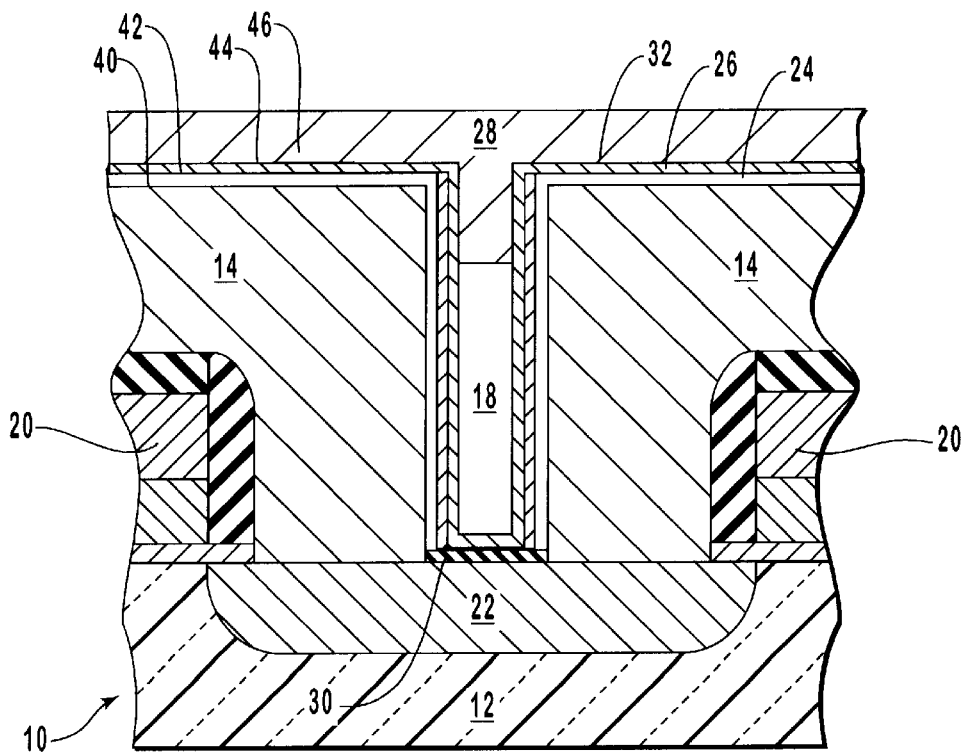
FIG. 6 is an elevational cross-section illustration of processing according to the inventive method for recess filling according to another embodiment of the inventive method, wherein the recess is a contact hole having a refractory metal layer that lines the wall of the contact hole within a semiconductor structure, the refractory metal layer having been superposed by a first and a second refractory metal nitride layer, and wherein a metallization layer has been formed that substantially covers over the opening to the contact hole.
Figure 7:
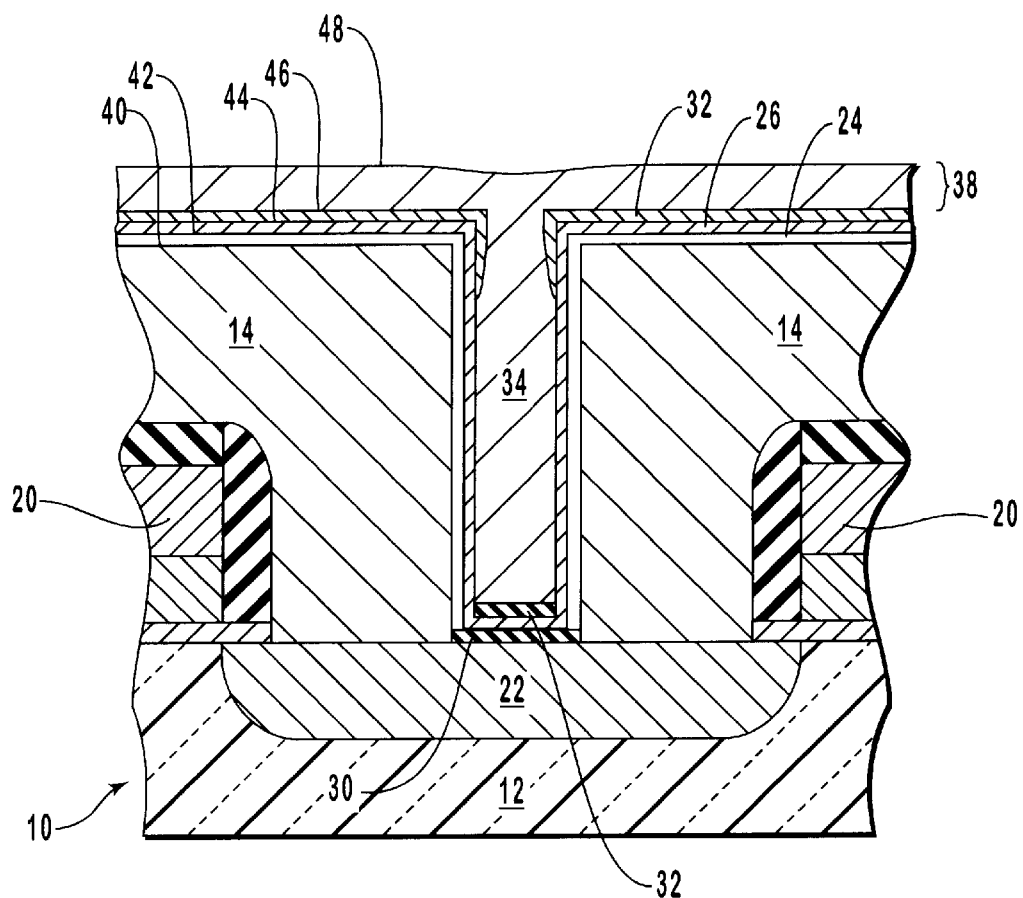
FIG. 7 illustrates further processing of the structure depicted in FIG. 6, wherein the contact hole has been substantially filled with the metallization layer to form a contact plug by increased pressure and/or temperature, and wherein a selected thickness of the metallization layer remains above the contact hole upon the semiconductor structure.

For the trench over contact hole structure known as a dual damascene structure seen in FIG. 5, second refractory metal nitride layer 32, as seen in FIGS. 6 or 7, can be formed upon first metal nitride layer 26, and is preferably formed from titanium nitride in a thickness range of from about 1,500 Å to about 2,500 Å, more preferably from about 1,750 Å to about 2,250 Å, and most preferably about 2,000 Å. Aluminum layer 28, as seen in FIG. 4 is formed correspondingly in a thickness range from about 1.2 microns to about 2.2 microns, more preferably from about 1.5 microns to about 1.9 microns, and most preferably about 1.7 microns.

FIG. 6 illustrates, by way of non-limiting example, partial formation of a contact plug in a high aspect ratio contact hole 18. Following a degassing process as described above, a second refractory metal nitride layer 32 is formed substantially over first metal nitride layer 26. FIG. 6 illustrates further processing of contact hole 18 wherein second refractory metal nitride layer 32 is formed by PVD. In FIG. 6, semiconductor structure 10 Upon refractory metal layer 24, first metal nitride layer 26 has been formed upon a second upper surface 42 of refractory metal layer 24. Upon first metal nitride layer 26, second refractory metal nitride layer 32 has been deposited by PVD and substantially covers a third upper surface 44 of first metal nitride layer 26. It can be seen that second refractory metal nitride layer 32 has thereupon a fourth upper surface 46. PVD formation of second refractory metal nitride layer 32 under conditions used in the present invention cause it to be thicker above dielectric layer 14 than along the vertical walls of contact hole 18, although it may be as thick at the bottom of contact hole 18 above refractory metal silicide layer 30. Various conventional PVD techniques can be used to achieve a uniform thickness of second refractory metal nitride layer 32, including "long throw", collimator techniques, and the like.

Following PVD formation of second refractory metal nitride layer 32, aluminum layer 28 is formed over contact hole 18 as seen in FIG. 6. Pressure filling of contact hole 18 is accomplished according to the method of the present invention as set forth previously. Preferably, recesses will be substantially filled with aluminum or alloys thereof under the inventive method by applying for a duration in a range from about 1 second to about 500 seconds at least one of pressure in the range of from about 450 atmospheres to about 1,050 atmospheres and heat in the range of from about 100° C. to about 700° C.

For the partial contact plug structure seen in FIG. 6, second refractory metal nitride layer 32 is preferably formed from titanium nitride in a thickness range from about 1,000 Å, to about 2,000 Å, more preferably about 1,250 Å to about 1,750 Å, and most preferably about 1,500 Å. Aluminum layer 28, as seen in FIG. 4 is formed correspondingly in a thickness range from about 0.8 microns to about 1.6 microns, more preferably from about 1.0 microns to about 1.4 microns, and most preferably about 1.2 microns.

After aluminum layer 28 has substantially filled a recess, as shown in either of FIGS. 5 or 7 at 34 and 34/36, respectively, surface metallization 38 may be entirely removed by such techniques as etchback or a planarizing process such as chemical mechanical planarization (CMP). Partial CMP of surface metallization 38 may be carried out, wherein a portion of surface metallization 38 remains to be patterned and further treated to form metallization lines having a fifth upper surface 48. CMP of surface metallization 38 assists in preventing unwanted reflective characteristics of surface metallization 38 when it is not substantially planar.

In another embodiment of the present invention, formation of the first metal nitride layer 26 is accomplished by the use of titanium tetrachloride (TiCl$_4$) in the presence of NH$_3$, H$_2$, and Ar. More preferably, an organometallic complex of titanium called tetrakis (dimethylamino) titanium (TDMAT) is used. TDMAT allows for a denser occurrence of both titanium and nitrogen in a titanium nitride layer according to formation of first metal nitride layer 26. TDMAT may be used in any embodiment of the present invention for CVD formation of first metal nitride layer 26. Other organometallic complexes may be used in the present invention with varying degrees of titanium and nitrogen density achieved in forming first metal nitride layer 26. The embodiment uses a degas step to remove any unwanted elements or compounds that reside in wall 50, whereas the first embodiment uses an NH$_3$ high-temperature treatment to remove impurities from wall 50.

In yet another embodiment of the present invention, the steps of precleaning, degas, and deposition of refractory metal layer 24 are accomplished as set forth above. Deposition of first metal nitride layer 26 is accomplished using trimethylethylenediamine tris (dimethylamino) titanium (TMEDT). Use of TMEDT allows for a higher percentage of titanium and nitrogen in a denser occurrence to deposit than in previous metal-organic deposition techniques. The aspect ratio of recesses that can be achieved when first metal nitride layer 26 is formed by TMEDT and the subsequent deposition of second refractory metal nitride layer by PVD, or the subsequent $NH_3$ treatment, can exceed about 6:1, for example about 7:1, about 8:1, about 9:1, and about 10:1.

Use of TMEDT may be applied in any embodiment of the present invention to assist in achieving high aspect ratio recess. TMEDT or TDMAT or a combination thereof may be used as set forth above. For example, an about 10:1 TMEDT:TDMAT ratio may be used. Other preferred ratios include about 8:1, 6:1, 4:1, 2:1, 1:1, 1:2, 1:4, 1:6, 1:8, and about 1:10.

Although FIGS. 5 and 7 illustrate distinct layers, such as refractory metal layer 24, first metal nitride layer 26 and second refractory metal nitride layer 32, it is understood that processing of semiconductor structure 10 may make residual signs of these layers difficult to detect when forensically examined due to processing that causes intermixing of these layers with neighboring structures.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A contact in a semiconductor structure comprising:
   a semiconductor substrate;
   a dielectric layer disposed upon said semiconductor substrate and having a top surface;
   a contact hole extending within said dielectric layer below the top surface thereof, said contact hole having an aspect ratio of at least about 6:1 and being defined by an exposed portion of said semiconductor substrate and a sidewall on said dielectric layer;
   a refractory metal layer disposed within said contact hole upon the sidewall of the dielectric layer;
   a refractory metal silicide structure within the contact hole upon the exposed portion of said semiconductor substrate;
   at least one refractory metal nitride layer upon said refractory metal layer within the contact hole, and upon the refractory metal silicide structure; and
   a metallization layer substantially filling the contact hole, extending above the top surface of the dielectric layer, and being situated upon said at least one refractory metal nitride layer, wherein the metallization layer is offset from and out of contact with the top surface of the dielectric layer.

2. A contact in a semiconductor structure according to claim 1, wherein said at least one refractory metal nitride layer comprises a single layer having a composition that is substantially devoid of interstitial impurities.

3. A contact in a semiconductor structure according to claim 1, wherein said at least one refractory metal nitride layer is substantially composed of titanium nitride.

4. A contact in a semiconductor structure according to claim 1, wherein said contact hole in said dielectric layer has an aspect ratio of at least about 7:1.

5. A contact in a semiconductor structure according to claim 1, wherein said at least one refractory metal nitride layer comprises at least two layers.

6. A contact in a semiconductor structure according to claim 1, wherein said contact hole extends from the exposed portion of said silicon substrate to the top surface of said dielectric layer.

7. A contact in a semiconductor structure according to claim 1, wherein:
   the contact hole extends from the exposed portion of said silicon substrate to terminate at a contact hole opening below the top surface of the dielectric layer;
   an elongated trench extending from a trench opening at the top surface of said dielectric layer to terminate at the contact hole opening below the top surface of the dielectric layer.

8. A contact in a semiconductor structure according to claim 5, wherein said two layers are substantially composed of titanium nitride.

9. A contact in a semiconductor structure according to claim 5, wherein said contact hole in said dielectric layer has an aspect ratio of at least about 7:1.

10. The contact as defined in claim 5, wherein the metallization layer contacts one of the two layers and is offset from and out of contact with the other of the two layers.

11. A method of forming a semiconductor structure according to claim 7, wherein the trench opening has a width that is wider than that of contact hole opening, and wherein the trench has a length substantially parallel to the semiconductor substrate that exceeds the width of the contact hole opening.

12. A contact in a semiconductor structure according to claim 7, wherein the trench opening has a width that is equal to that of the contact hole opening, and wherein the trench has a length substantially parallel to the semiconductor substrate that exceeds the width of the contact hole opening.

13. A contact in a semiconductor structure according to claim 7, wherein the trench opening has a width that is less than that of the contact hole opening, and wherein the trench has a length substantially parallel to the semiconductor substrate that exceeds the width of the contact hole opening.

14. The contact as defined in claim 1, wherein the metallization layer is offset from and out of contact with the refractory metal layer above the top surface of the dielectric layer.

15. A contact in a semiconductor structure according to claim 1, wherein:
   the sidewall of the dielectric layer intersects a bottom of the contact hole at the exposed portion of said semiconductor substrate;
   said at least one refractory metal nitride layer comprises:
      a first refractory metal nitride layer that extends continuously over the top surface of the dielectric layer, parallel to the sidewall of the dielectric layer, and over the bottom of the contact hole;
      a second refractory metal nitride layer that is disposed over the top surface of the dielectric layer, over the bottom of the contact hole, and is discontinuous therebetween.

16. A contact in a semiconductor structure comprising:
   a silicon substrate;
   a dielectric layer disposed upon said silicon substrate and having a top surface;
   a contact hole extending within said dielectric layer below the top surface thereof, said contact hole having an aspect ratio of at least about 6:1 and being defined by an exposed portion of said silicon substrate and a sidewall on said dielectric layer;

a titanium layer disposed within said contact hole upon the sidewall of the dielectric layer;

a titanium silicide layer within the contact hole upon the exposed portion of said silicon substrate;

at least one titanium nitride layer upon said titanium layer within the contact hole, and upon the titanium silicide layer; and an aluminum or aluminum alloy layer substantially filling the contact hole, extending above the top surface of the dielectric layer, and being situated upon said at least one titanium nitride layer, wherein said aluminum or aluminum alloy layer is kept from contacting the top surface of the dielectric layer by said at least one titanium nitride layer.

17. A contact in a semiconductor structure according to claim 16, wherein:

the sidewall of the dielectric layer intersects a bottom of the contact hole at the exposed portion of said semiconductor substrate;

said at least one titanium nitride layer comprises:
  a first titanium nitride layer that extends continuously over the top surface of the dielectric layer, parallel to the sidewall of the dielectric layer, and over the bottom of the contact hole;
  a second titanium nitride layer that is disposed over the top surface of the dielectric layer, over the bottom of the contact hole, and is discontinuous therebetween.

18. A contact in a semiconductor structure according to claim 7, wherein:

an elongated trench extends from a trench opening at the top surface of said dielectric layer to terminate at the contact hole opening below the top surface of the dielectric layer, said trench being substantially filled by said aluminum or aluminum alloy layer.

19. A contact in a semiconductor structure according to claim 16, wherein the contact is electrically connected to said silicon substrate and has a substantially uniform electrical resistivity.

20. The contact as defined in claim 16, wherein the aluminum or aluminum alloy layer is offset from and out of contact with the titanium layer above the top surface of the dielectric layer.

21. A contact in a semiconductor structure according to claim 15, wherein the trench opening has a width that is less than that of the contact hole opening, and wherein the trench has a length substantially parallel to the semiconductor substrate that exceeds the width of the contact hole opening.

22. A method of forming a semiconductor structure according to claim 18, wherein the trench opening has a width that is wider than that of contact hole opening, and wherein the trench has a length substantially parallel to the semiconductor substrate that exceeds the width of the contact hole opening.

23. A contact in a semiconductor structure according to claim 18, wherein the trench opening has a width that is equal to that of the contact hole opening, and wherein the trench has a length substantially parallel to the semiconductor substrate that exceeds the width of the contact hole opening.

24. A contact in a semiconductor structure according to claim 18, wherein the trench opening has a width that is less than that of the contact hole opening, and wherein the trench has a length substantially parallel to the semiconductor substrate that exceeds the width of the contact hole opening.

25. A contact structure including a semiconductor substrate and a dielectric layer disposed thereon, the dielectric layer having a top surface, where an elongated trench extends from a trench opening at the top surface of said dielectric layer to terminate at a bottom surface below the top surface of the dielectric layer, and a contact hole extends within the dielectric layer from an opening at the bottom surface of the trench to an exposed portion of said semiconductor substrate, the contact hole being defined by a sidewall on said dielectric layer and a lower surface at the exposed portion of said silicon substrate, wherein a metallization layer extends continuously within by the trench and the contact hole and is electrically connected to the exposed portion of said semiconductor substrate, the contact structure comprising:

a refractory metal layer conformably disposed upon the sidewall of the dielectric layer within the contact hole;

a refractory metal silicide structure intersecting the refractory metal layer within the contact hole and being disposed upon the lower surface of the contact hole;

a first refractory metal nitride layer conformably disposed upon said refractory metal layer within the contact hole and upon the refractory metal silicide structure; and a second refractory metal nitride layer disposed over the top surface of the dielectric layer, over the lower surface of the contact hole, and being discontinuous therebetween, wherein the metallization layer contacts both the first and second refractory metal nitride layers below the top surface of the dielectric layer and is offset from and out of contact with the top surface of the dielectric layer.

26. A contact structure according to claim 25, wherein the trench opening has a width that is wider than that of contact hole opening, and wherein the trench has a length substantially parallel to the semiconductor substrate that exceeds the width of the contact hole opening.

27. A contact structure according to claim 25, wherein there is deposed over the top surface of the dielectric layer:

the refractory metal layer upon the top surface of the dielectric layer;

the first refractory metal nitride layer upon there refractory metal layer;

the second refractory metal nitride layer upon the first refractory metal nitride layer; and the metallization layer upon the second refractory metal nitride layer.

28. A contact structure according to claim 27, wherein the metallization layer is separated from and is kept out of contact hole with the top surface of the dielectric layer by the refractory metal layer, the first refractory metal nitride layer, and the second refractory metal nitride layer.

29. A contact structure according to claim 25, wherein:

the refractory metal layer is composed of titanium;

the refractory metal silicide layer is composed of titanium silicide; and both the first and second refractory metal nitride layers are composed of titanium.

30. A contact structure according to claim 25, wherein the contact hole in said dielectric layer has an aspect ratio of at least about 6:1.

31. A contact structure according to claim 25, wherein the trench opening has a width that is not has wide as that of contact hole opening, and wherein the trench has a length substantially parallel to the semiconductor substrate that exceeds the width of the contact hole opening.

* * * * *

UNITED STATES PATENT AND TRADEMARK OFFICE
CERTIFICATE OF CORRECTION

PATENT NO. : 6,054,768
DATED : April 25, 2000
INVENTOR(S) : John H. Givens, Russell C. Zahorik, Brenda D. Kraus It is certified that error appears in the above-identified patent and that said Letters Patent is hereby corrected as shown below:

Title page,
Please change "METAL FILL" to -- IMPROVED METAL FILL --

Column 1,
Line 1, please change "METAL FILL" to -- IMPROVED METAL FILL --
Line 56, please change "Alignment By of" to -- Alignment of --

Column 7,
Line 63, please change "(BOLD) 10 (BOLD) Upon" to -- (BOLD) 10 (BOLD) has been built up with refractory metal layer (BOLD) 24 (BOLD) that is in contact with dielectric layer (BOLD) 14 (BOLD). Upon --

Column 11,
Line 32, please change "claim (BOLD) 7 (BOLD), wherein:" to -- claim (BOLD) 16 (BOLD), wherein: --
Line 47, please change "claim (BOLD) 15 (BOLD), wherein:" to -- claim (BOLD) 18 (BOLD), wherein: --

Signed and Sealed this

Twenty-third Day of October, 2001

*Attest:*

*Nicholas P. Godici*

NICHOLAS P. GODICI
*Attesting Officer*   *Acting Director of the United States Patent and Trademark Office*